United States Patent [19]
Nishimoto

[11] Patent Number: 5,506,173
[45] Date of Patent: Apr. 9, 1996

[54] PROCESS OF FABRICATING A DIELECTRIC FILM FOR A SEMICONDUCTOR DEVICE

[75] Inventor: Shozo Nishimoto, Tokyo, Japan

[73] Assignee: NEC Corporation, Tokyo, Japan

[21] Appl. No.: 957,389

[22] Filed: Oct. 7, 1992

[30] Foreign Application Priority Data

Oct. 7, 1991 [JP] Japan ................ 3-259007

[51] Int. Cl.⁶ .......................... H01L 21/312; H01L 21/47
[52] U.S. Cl. ................................ 437/195; 437/229
[58] Field of Search .................... 437/195, 187, 437/228, 927, 982, 229, 228 O; 148/DIG. 50, DIG. 73, DIG. 75, DIG. 137

[56] References Cited

U.S. PATENT DOCUMENTS

| | | | |
|---|---|---|---|
| 4,038,110 | 7/1977 | Feng | 156/659.1 |
| 4,618,878 | 11/1986 | Aoyama et al. | 156/644 |
| 4,996,165 | 2/1991 | Chang et al. | 437/31 |
| 5,070,037 | 12/1991 | Leisure et al. | 437/189 |

Primary Examiner—George Fourson
Assistant Examiner—C. Everhart
Attorney, Agent, or Firm—Burns, Doane, Swecker & Mathis

[57] ABSTRACT

A method of processing an insulating film containing voids associated with the increased semiconductor device density is performed. An insulating film containing voids is coated with another insulating film by spin-on technique to substantially close up the voids, followed by photolithography process. By the processing without adverse affects from the presence of voids, for example, an undamaged cover film can formed, which can contribute to greater reliability of semiconductor devices.

4 Claims, 4 Drawing Sheets

PROCESS OF FABRICATING A DIELECTRIC FILM FOR A SEMICONDUCTOR DEVICE

BACKGROUND OF THE INVENTION

1. Field of the Invention

This invention relates to a process of fabricating a semiconductor device, and more particularly to a method of processing a dielectric film using photolithography.

2. Description of the Prior Art

As well-known, photolithography involves selectively patterning a photoresist film coated over a wafer on the same principle as photography, and using the patterned photoresist film as a mask for etching, and/or introducing impurities through to an exposed wafer surface. For realization of scaling down of semiconductor devices which is one of trends these days, one of the most important keys is, as well known, to make the photoresist pattern more precise without losing the masking ability.

The photolithography process in the prior art will be described by way of an example of processing a cover film of the semiconductor memory device.

A silicon substrate on which circuit elements such as transistors are built is covered with a dielectric layer as of silicon oxide film, and then through-holes and others structures are formed. On the dielectric layer an Al-Si alloy film is deposited to a 1 μm thickness, followed by patterning to form a number of word lines, 1 μm wide and about 1 mm long in parallel arrangement with a 1.2 μm spacing. A 1 μm-thick silicon oxynitride film is deposited over the resulting structure by plasma CVD technique to form a passivation film. The passivation film thus formed has a poor step coverage, which allows easy formation of voids between the word lines, such as cave-like voids having an opening at each end of the word line group. There is a tendency toward formation of, so to speak, roof windows at the right-angle bends of word lines, and hence in the case where any word line ends there, a larger opening is produced. A photoresist film is deposited on the wafer by a spin-on technique. Then the photoresist is forced to flow into the voids, especially, cave-like voids, which as a result become bubbles. After exposure and development, the passivation film is etched, accompanied by a thinning of the photoresist film, which forces the voids to break. Near these, unwanted etching and the consequent damage of the passivation film result.

As described above, with scaling down of the semiconductor device, the topology of the photolithography-processed substrate surface becomes complicated. In this circumstances, deposition of the dielectric film by CVD technique may be accompanied by formation of voids. This leads to poor masking ability of photoresist film for processing insulating films, inevitably only damaged dielectric layers and cover films being formed. There is danger associated with such a dielectric layer to bring about insulation failure. The use of such a cover film may be the cause of lowering the reliability under severe conditions of high temperature and humidity even if operation of the semiconductor device itself is unaffected in an ordinary environment.

SUMMARY OF THE INVENTION

It therefore is a principal object of the invention to provide a process of fabricating a semiconductor device which avoids the adverse effects of voids in an insulating film and thus to improve the reliability of the resulting device.

A process of fabricating a semiconductor device according to the present invention comprises the steps of: forming electrode leads on a specified dielectric layer over a semiconductor chip, and forming thereover a first insulating film, occasionally attending formation of voids. The first insulating film is coated at least selectively with a second insulating film by a spin-on technique so that the voids are substantially closed up. The first insulating film is etched using photolithography.

If the first insulating film is a passivation film, a positive photoresist film can be used as the second insulating film. The positive photoresist film is formed by spin-on technique, the whole surface of it being exposed, and removed by subsequent development except the void portions. Besides the passivation film is etched using photolithography to form cover film.

Due to a process step which substantially closes up voids in the first insulating film, adverse effects of voids on the photolithographic process can be avoided.

BRIEF DESCRIPTION OF THE DRAWINGS

The above-mentioned and other objects, features and advantages of this invention will become more apparent by reference to the following detailed description thereof taken in conjunction with the accompanying drawings, wherein.

DETAILED DESCRIPTION OF THE INVENTION

Figure 1:
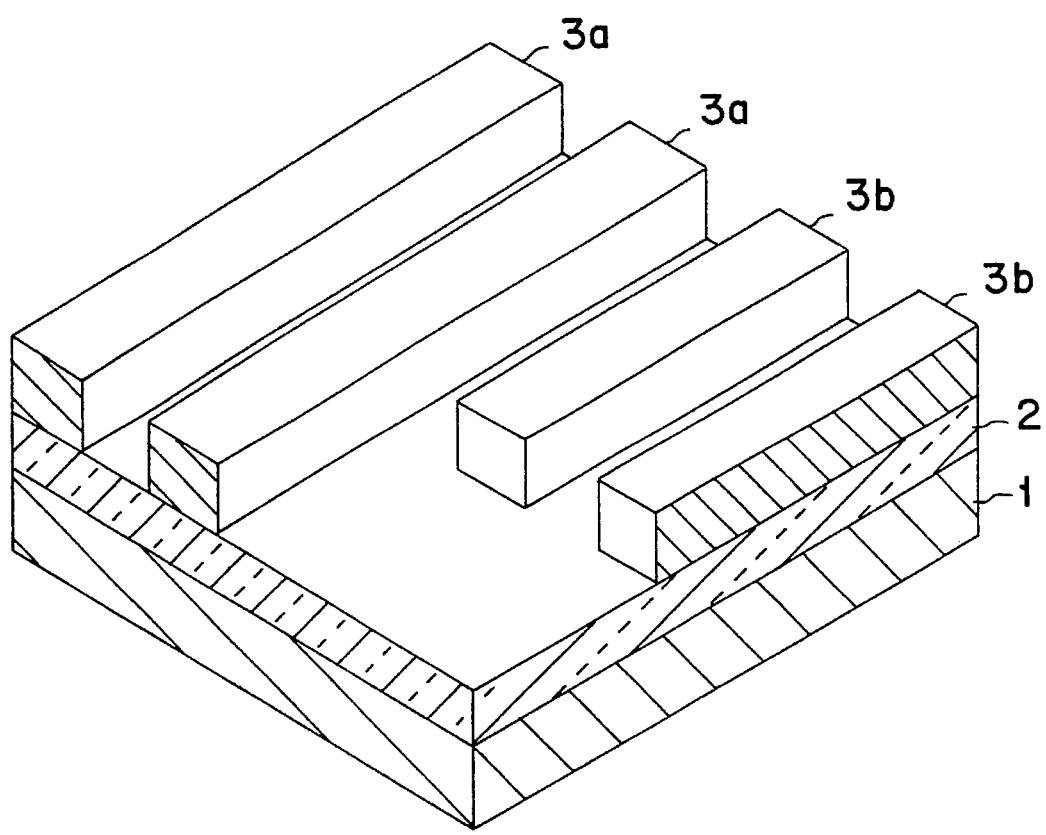
FIG. 1 is a fragmentary perspective-sectional view of a semiconductor chip in an intermediate processing step for illustrating the first embodiment of the present invention.

Referring to FIG. 1, the first embodiment of the present invention will be set forth below. On the surface of a silicon substrate 1 is selectively formed a field oxide (not shown). In the thus-defined device-formed region, a circuit element such as transistor is built, and then desired electrode leads are formed. The prepared semiconductor chip is shown in FIG. 1 where, for convenience of illustration, the top dielectric layer 2 becomes deposited directly over the silicon substrate 1 though between these, in practice, field oxide films, lower dielectric layers are commonly provided. Over the top dielectric layer, an Al-Si alloy film is deposited to a 1 μm thickness by sputtering technique, followed by patterning, to form electrodes leads 3a, 3b. Electrode leads 3b, such as word lines in a semiconductor memory, are 1 μm wide, about 1 mm long with a 1.2 μm spacing between them.

Figure 2:
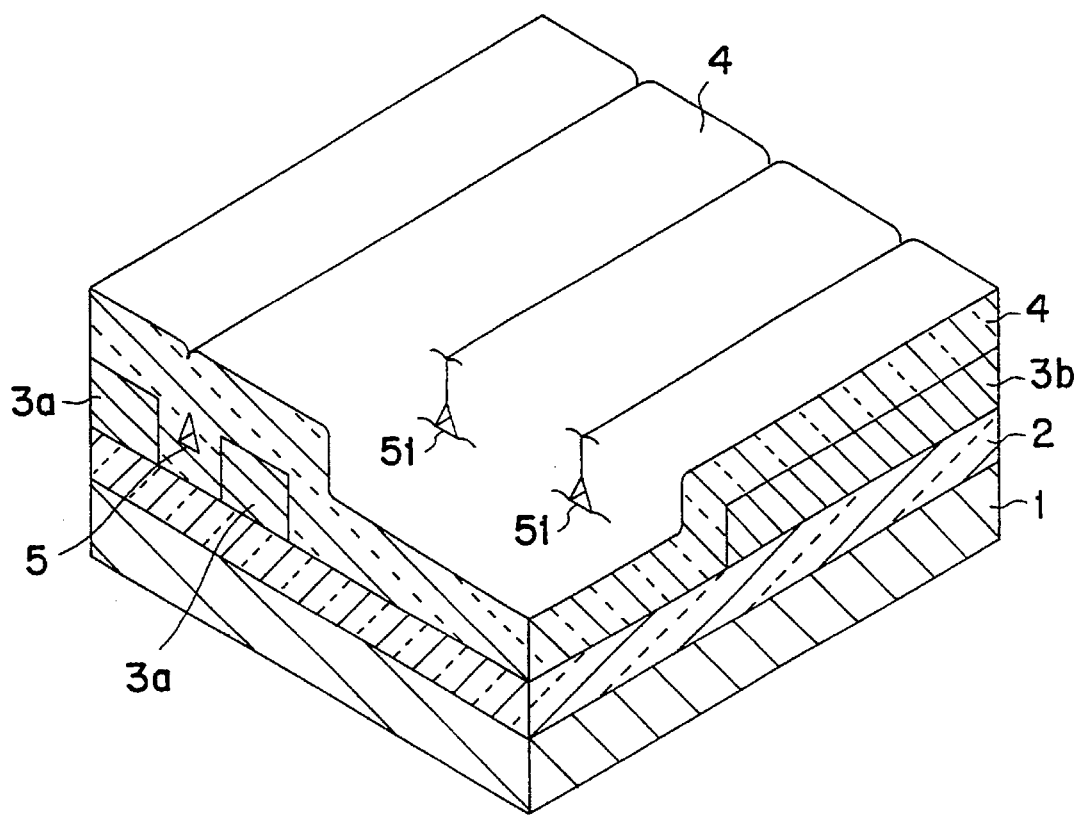
FIG. 2 is a fragmentary perspective-sectional view of a semiconductor chip in the next processing step to FIG. 1.
Figure 3:
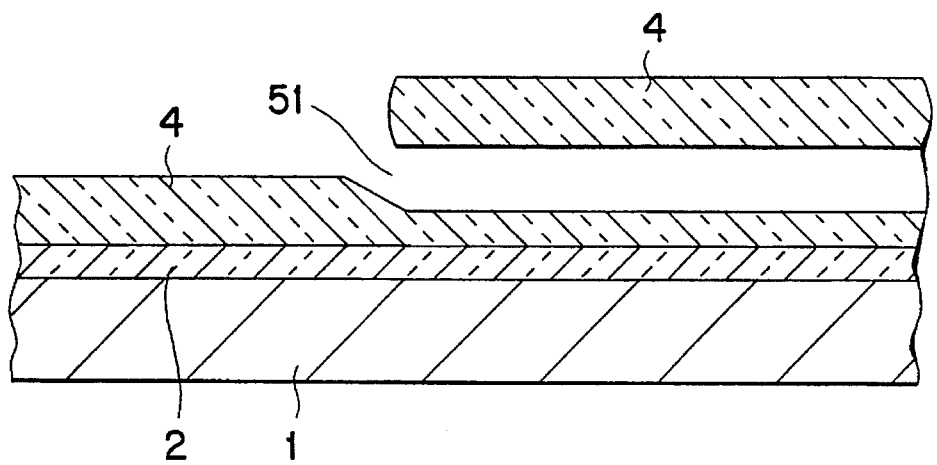
FIG. 3 is a cross-sectional view near a cave-like void 51 in FIG. 2.

Referring to FIGS. 2 and 3, an about 1 μm-thick silicon oxynitride film 4 is deposited by plasma CVD technique. Then, owing to poor step coverage with the silicon oxynitride film 4, voids 5 are often formed. Any one of the parallel-arrange electrode leads 3b having an end allows easy formation of a cave-like void 51 with an opening at the end. After surface treatment with hexamethyldisilazane (HMDS), a positive photoresist (about 50 cp in viscosity and sensitive to 436 nm wavelength, 'g' line) is spun on its with revolution speed of about 500 rpm.

Figure 4:
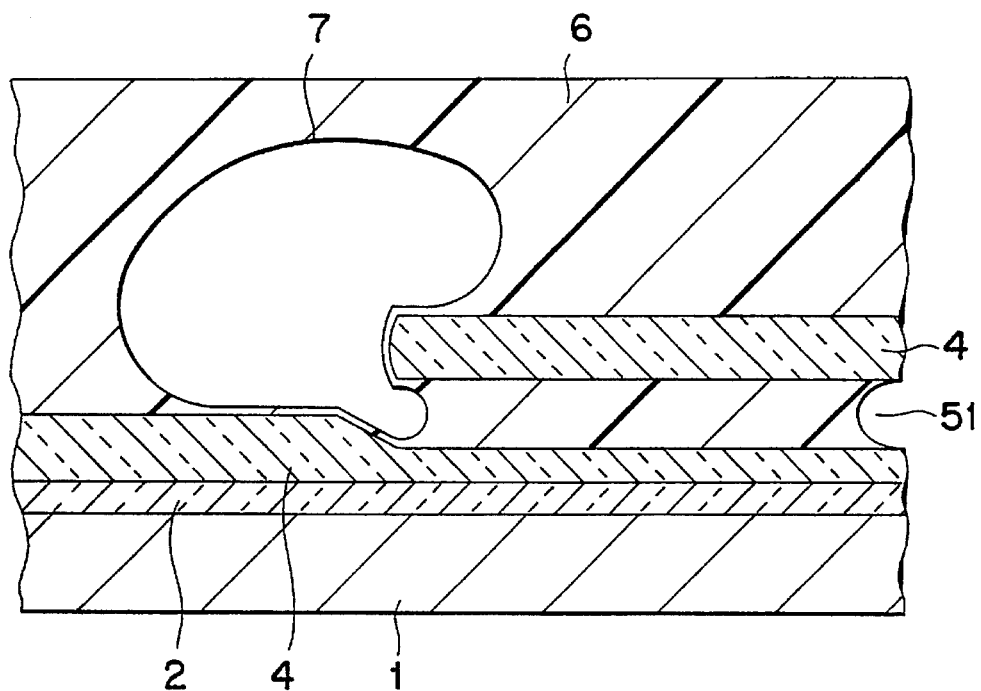
FIG. 4 is the cross-sectional view corresponding, and in the next processing step, to FIGS. 2 and 3.
Figure 5:
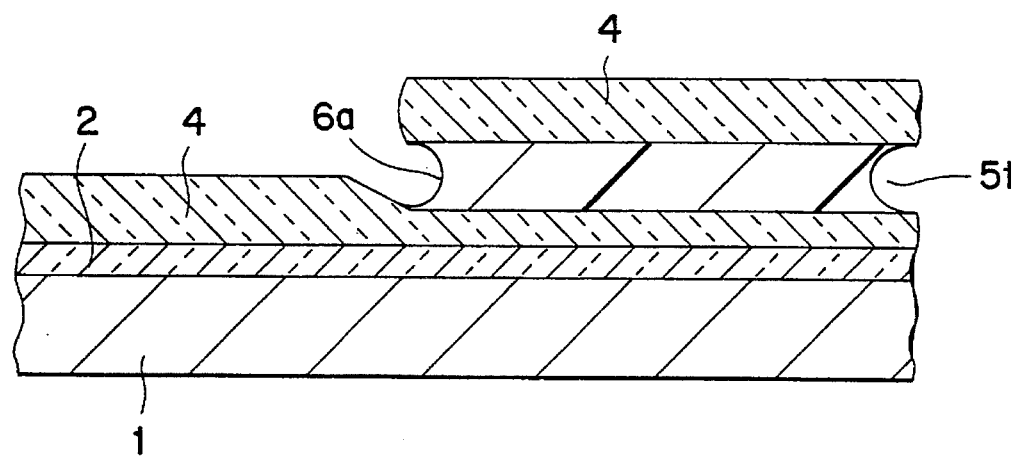
FIG. 5 is a cross-sectional view corresponding, and in the next processing step, to FIG. 4.

Referring to FIG. 4, baking is carried out with a hot plate at 100° C. for about 40 sec to form a positive photoresist film 6 of about 4 μm thick in the flat part. During the processing step of forming the positive photoresist film, air is driven out of the cave-like void 51 to become a bubble 7. Then the near opening of the cave-like void 51 is filled up with photoresist film. The subsequent processing steps: exposure, development, etching of silicon oxynitride film 4 are performed in the usual manner, resulting in sequence in thinning positive photoresist film 6, breaking bubble 7, and locally losing masking ability. In this embodiment, after being formed, positive photoresist film 6 is wholly exposed for about 10 sec, and then developed with a diluted solution of tetramethylammonium hydroxide (TMAH), leaving the positive photoresist film 6a near the opening of the cave-like void 51 as shown in FIG. 5. The reason for this is to result in poor exposure because of being covered with silicon oxynitride film 4, and considered substantially impossible to remove it because of small void diameter even if exposed sufficiently.

Figure 6:
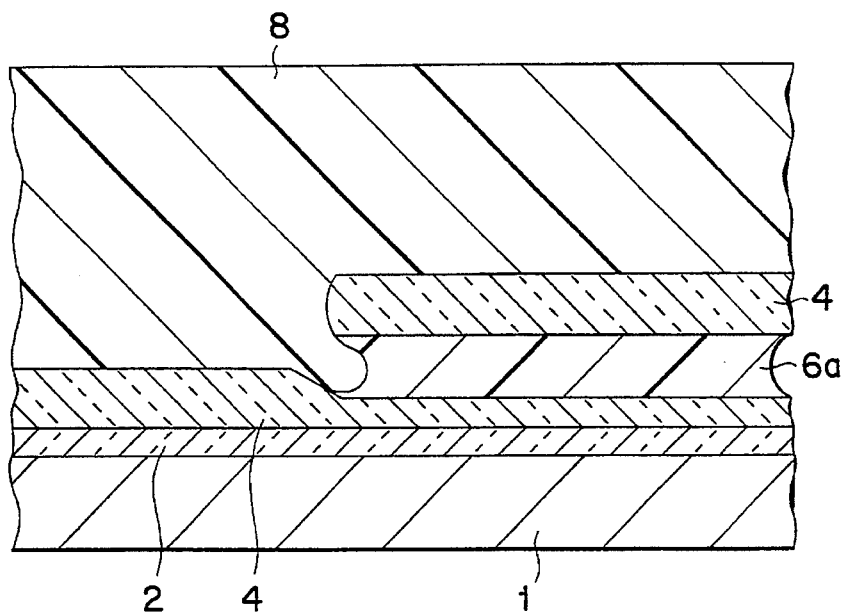
FIG. 6 is a cross-sectional view corresponding, and in the next processing step, to FIG. 5.

After performing, again in the same way as described above, HMDS treatment, a positive photoresist is spun on and baked at 100° C. to form a positive photoresist film 8 as shown in FIG. 6. Subsequent exposure and development for removing silicon oxynitride film 4 on the bonding pad (not shown), followed by baking at 120° C. for 4 min, are carried out to form an etching mask. Few bubbles were observed in this mask while the firstly-formed positive photoresist film 6 in FIG. 4 contained a number of bubbles. In the next step, the silicon oxynitride film 4 is removed from the surface of the bonding pad by plasma etching using a gas mixture of carbon tetrafluoride CF₄ and oxygen, and then the positive photoresist film is removed with a stripping solution. In this way a cover film is obtained.

After 10 minutes' immersion in a mixed solution (60° C.) of phosphoric acid, nitric acid and acetic acid capable of dissolving Al-Si alloy film, no damage was seen about electrode leads covered with the cover film. It therefore has been demonstrated to be possible to form good cover film, contributing to further improvement in reliability of semiconductor devices.

For use as cover film material are suitable silicon nitride, and silicon oxide in addition to silicon oxynitride. Silicon oxide film is permeable to U. V. light, and can substantially close up voids for the above-mentioned reasons.

The second embodiment of the present invention will be set forth below.

Figure 7:
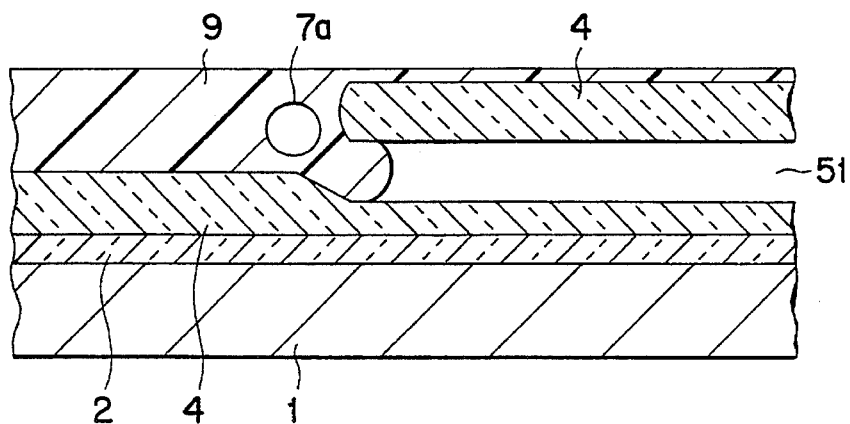
FIG. 7 is a cross-sectional view near a void for illustrating a second embodiment of the present invention.
Figure 8:
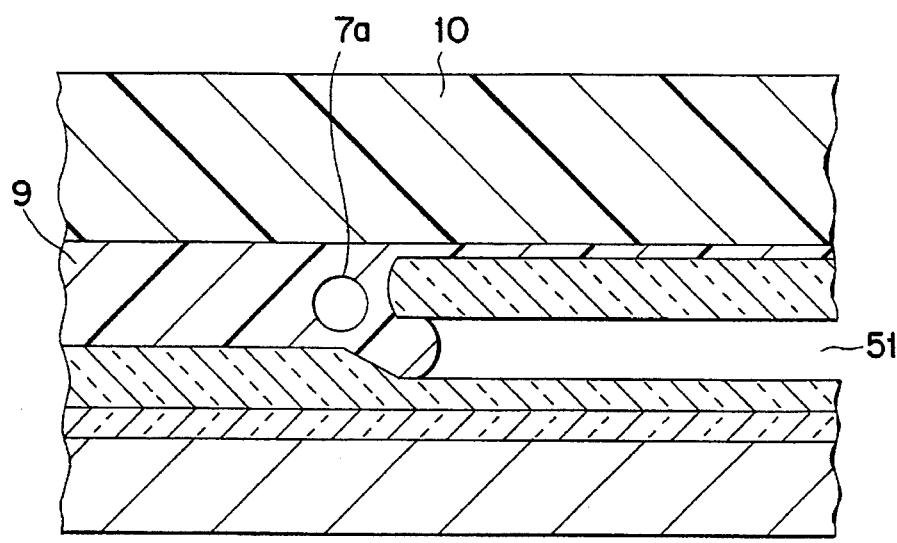
FIG. 8 is a cross-sectional view corresponding, and in the next processing step, to FIG. 7.

Following the processing step described with reference to FIGS. 2 and 3, a polyimide precursor is deposited by spin-on technique, and prebaked at about 130° C. to form a polyimide film 9 as shown in FIG. 7. The thickness of polyimide film 9 may be such that closes up the opening of the cave-like void 51, or may be one that is about 100 nm over the surface of silicon oxynitride film 4 covering void 51 also for serving as planarization. A bubble 7a is formed in polyimide film 9. As shown in FIG. 8, the surface is covered with positive photoresist film 10, exposed, and developed to form an etching mask. Polyimide film 9 except the masked portion is etched away. As an etchant for this may be used a developing solution for positive photoresist film (a diluted TMAH aqueous solution). The silicon oxynitride film is selectively etched by plasma etching, and then the positive photoresist film is stripped, followed by thermal treatment at 350° C. for hardening of the polyimide film. In this way a cover film is obtained. Even if the polyimide film contains bubbles 7a, the masking ability of the positive photoresist film will not be damaged. Furthermore, the thus-built two-layer structure cover film consisting of silicon oxynitride 4 and polyimide film 9 can contribute to greater reliability.

In this embodiment, silicon nitride film or silicon oxide film may be used in place of silicon oxynitride. Application is possible to not only formation of cover films but also formation of dielectric films.

The above-description describes a method of closing up cave-like voids. Similar procedure is applicable to substantially close up vertical holes with or without a roof opening.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications within the true scope of the invention.

What is claimed is:

1. A process of fabricating a semiconductor device comprising the steps of:

covering a semiconductor substrate with a dielectric layer, said dielectric layer having a first portion, a second portion and a third portion between said first and second portions;

forming first and second conductive lead layers on said first and second portions of said dielectric layer, respectively;

covering said first and second conductive lead layers and said dielectric layer with an insulating film such that said insulating film has a substantially even surface over said first and second conductive layers and said third portion of said dielectric layer, said third portion of said dielectric layer has such a width that a void is formed in a part of said insulting film covering said third portion of said dielectric layer;

coating a first photoresist film on said insulating film while filling said void with a portion of said first photoresist film;

exposing said first photoresist film, said insulting film surrounding said void preventing exposure of said portion of said first photoresist film;

removing said first photoresist film to expose said insulating film while leaving said void filled with said portion said first photoresist film;

coating a second photoresist film on said insulting film in contact with said portion of said first photoresist film filling said void; and selectively subjecting said second photoresist film to exposure.

2. The process as claimed in claim 1, wherein said step of removing said first photoresist film includes the step of developing a remaining portion of said first photoresist film except said portion of said first photoresist film.

3. The process as claimed in claim 2, wherein said first photoresist film is of a positive type.

4. A process for fabricating a semiconductor device comprising the steps of:

forming an insulating film over a semiconductor substrate, said insulating film including a void therein;

coating a first photoresist film on said insulating film while filling said void with a portion said first photoresist film;

exposing said first photoresist film while said portion of said first photoresist film is protected from exposure by said insulating film surrounding said void;

developing said first photoresist film to remove said first photoresist film so that said insulating film is exposed with laving said void filled with said first portion of said first photoresist film;

coating a second photoresist film on said insulating film in contact with said portion of said first photoresist film; and forming a hole in said second photoresist film to expose a part of said insulating film.

* * * * *